United States Patent
Wade

(10) Patent No.: US 9,548,519 B2
(45) Date of Patent: Jan. 17, 2017

(54) CLAMP-ON EASY-INSTALL WIRELESS BATTERY DATA SENSOR AND ASSOCIATED USE THEREOF

(71) Applicant: NergySense, LLC, Charlottesville, VA (US)

(72) Inventor: James R Wade, Barboursville, VA (US)

(73) Assignee: NergySense, LLC, Charlottesville, VA (US)

( * ) Notice: Subject to any disclaimer, the term of this patent is extended or adjusted under 35 U.S.C. 154(b) by 237 days.

(21) Appl. No.: 14/226,751

(22) Filed: Mar. 26, 2014

(65) Prior Publication Data

US 2015/0204912 A1 Jul. 23, 2015

Related U.S. Application Data

(60) Provisional application No. 61/805,150, filed on Mar. 26, 2013.

(51) Int. Cl.
*H01M 10/48* (2006.01)
*G01R 31/36* (2006.01)
*H01M 10/06* (2006.01)

(52) U.S. Cl.
CPC .......... *H01M 10/48* (2013.01); *G01R 31/3624* (2013.01); *G01R 31/3648* (2013.01); *H01M 10/06* (2013.01)

(58) Field of Classification Search
CPC ................................................... G01R 15/202
See application file for complete search history.

(56) References Cited

U.S. PATENT DOCUMENTS

| | | | | |
|---|---|---|---|---|
| 4,237,198 A | * | 12/1980 | Eby | G01R 31/3686 340/636.15 |
| 4,248,942 A | * | 2/1981 | Eby | H01M 10/48 429/178 |
| 5,349,289 A | * | 9/1994 | Shirai | G01R 1/22 324/116 |
| 6,871,151 B2 | | 3/2005 | Bertness | |
| 7,003,411 B2 | | 2/2006 | Bertness | |
| 7,173,429 B2 | | 2/2007 | Kutkut et al. | |
| 7,772,850 B2 | | 8/2010 | Bertness | |
| 7,774,151 B2 | | 8/2010 | Bertness | |
| 8,180,515 B2 | | 5/2012 | Namaky | |

(Continued)

OTHER PUBLICATIONS

International Search Report dated Feb. 27, 2013.

*Primary Examiner* — Drew A Dunn
*Assistant Examiner* — Tynese McDaniel
(74) *Attorney, Agent, or Firm* — Symbus Law Group, LLC; Clifford D. Hyra

(57) ABSTRACT

A new data sensor for industrial lead-acid batteries monitors current, voltage, and battery temperature. It comes in a compact, easy-to-install, lost-cost mechanical clamping package with minimal firmware and low cost of ownership. It includes a cable guide configured to restrict the movement of a cable positioned within the cable guide, an electrical power pin configured to pierce the cable positioned within the cable guide to provide an electrical connection to the cable, a tri-axis Hall Effect sensor configured to sense a current flowing through the cable positioned within the cable guide, and a clamping structure configured to clamp the cable positioned within the cable guide and prevent movement of the cable relative to the tri-axis Hall Effect sensor.

18 Claims, 15 Drawing Sheets

(56) References Cited

U.S. PATENT DOCUMENTS

| | | | |
|---|---|---|---|
| 8,203,328 B2* | 6/2012 | Bose | G01R 1/22 |
| | | | 324/117 H |
| 8,344,685 B2 | 1/2013 | Bertness et al. | |
| 8,386,199 B2 | 2/2013 | Goff et al. | |
| 2006/0132141 A1* | 6/2006 | Dougherty | B60L 11/1857 |
| | | | 324/435 |
| 2010/0194576 A1 | 8/2010 | Bertness | |
| 2011/0208648 A1 | 8/2011 | Alothaimeen | |
| 2012/0035876 A1 | 2/2012 | Bertness et al. | |
| 2012/0280653 A1 | 11/2012 | Prosser et al. | |
| 2012/0330475 A1 | 12/2012 | Chen | |
| 2013/0033102 A1 | 2/2013 | Goff et al. | |

\* cited by examiner

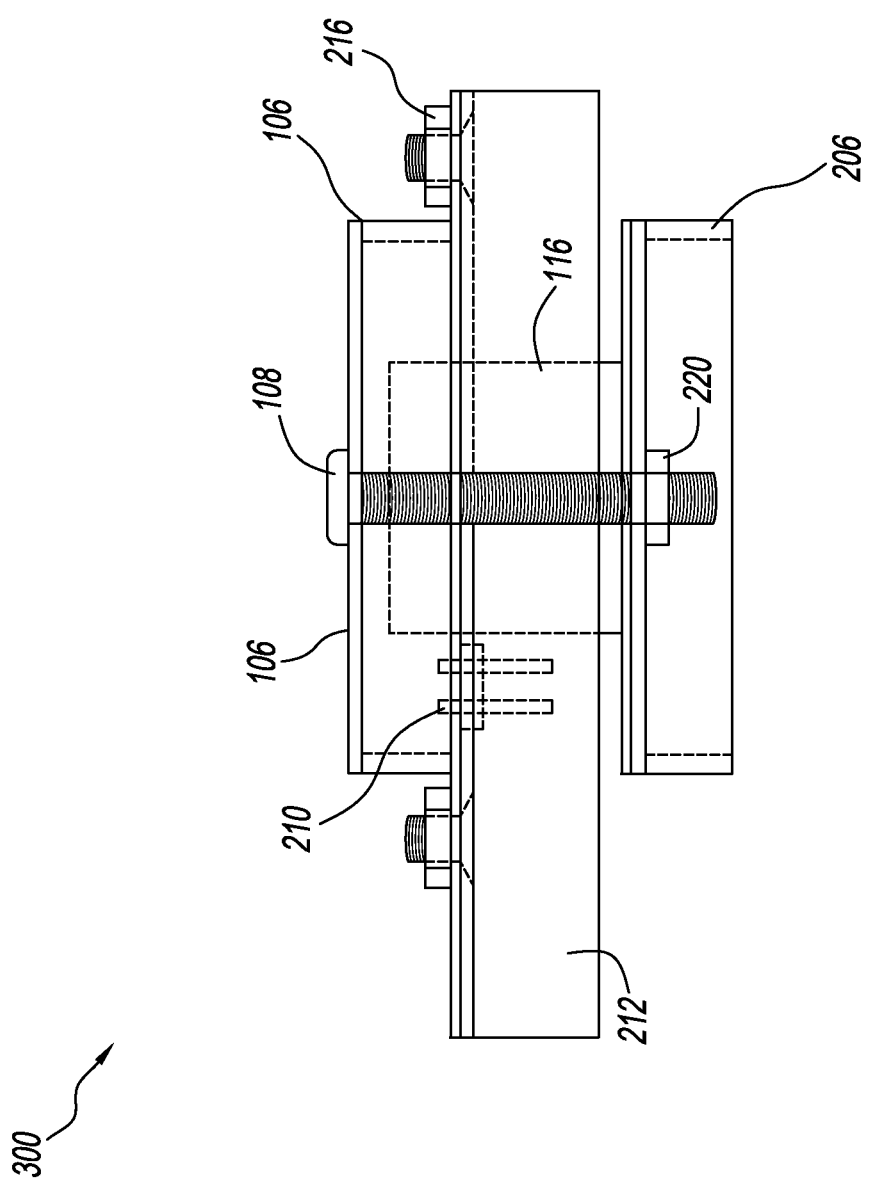

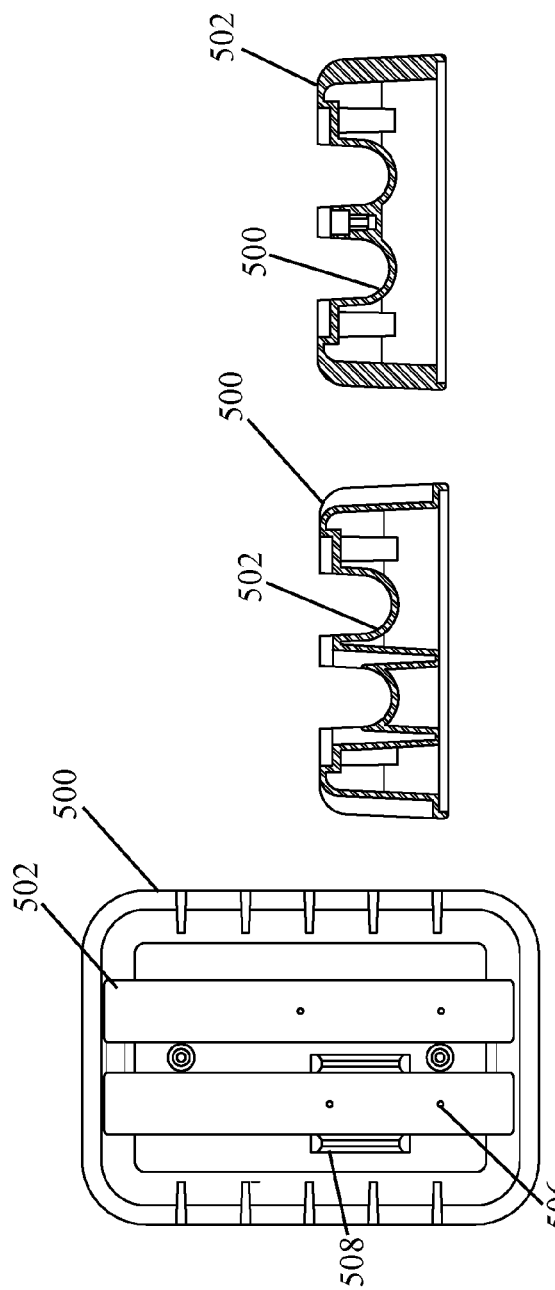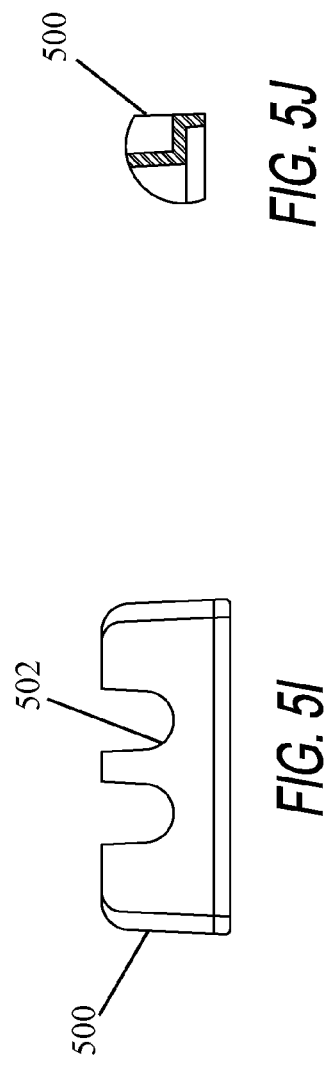
FIG. 5F
FIG. 5G
FIG. 5H
FIG. 5I
FIG. 5J

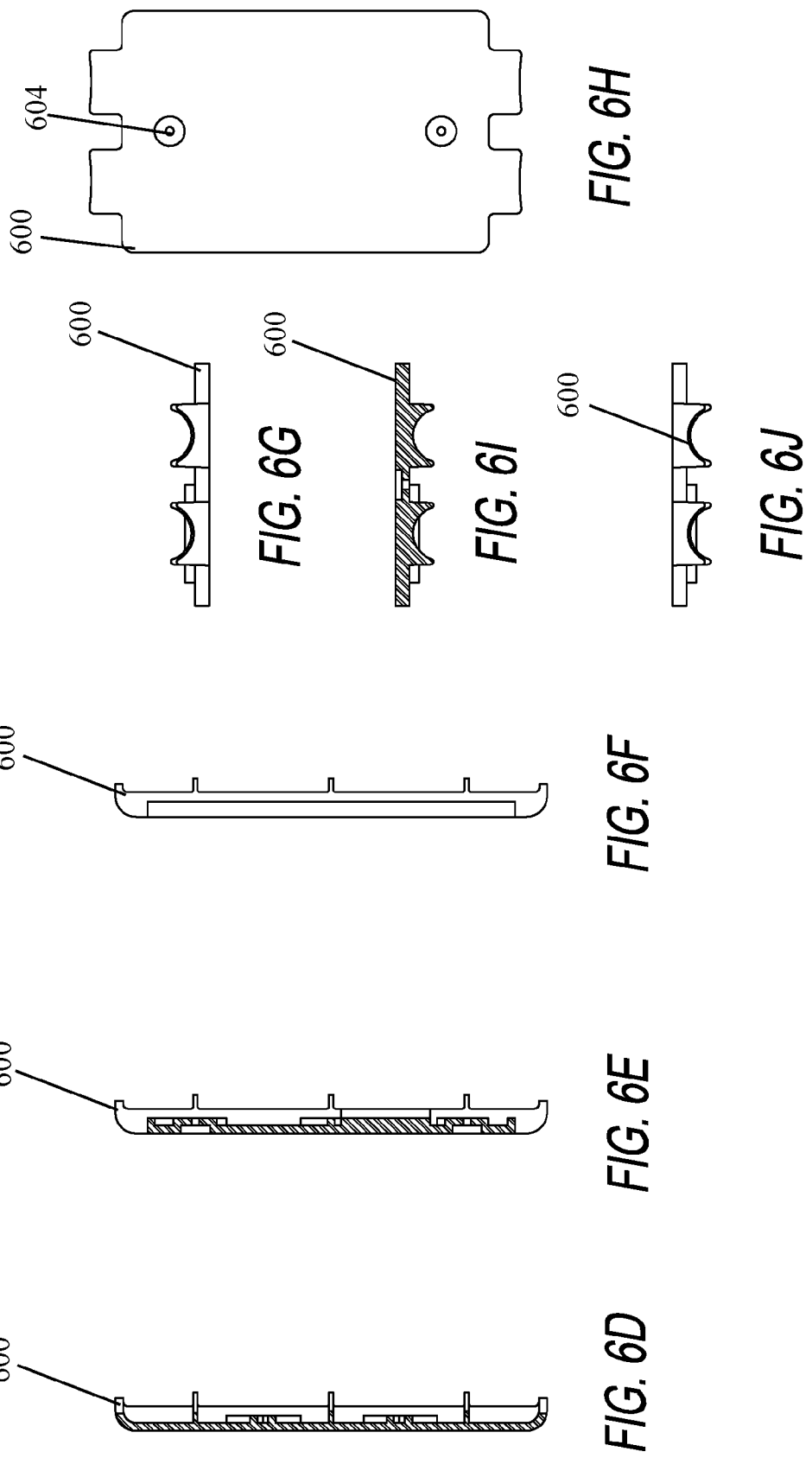

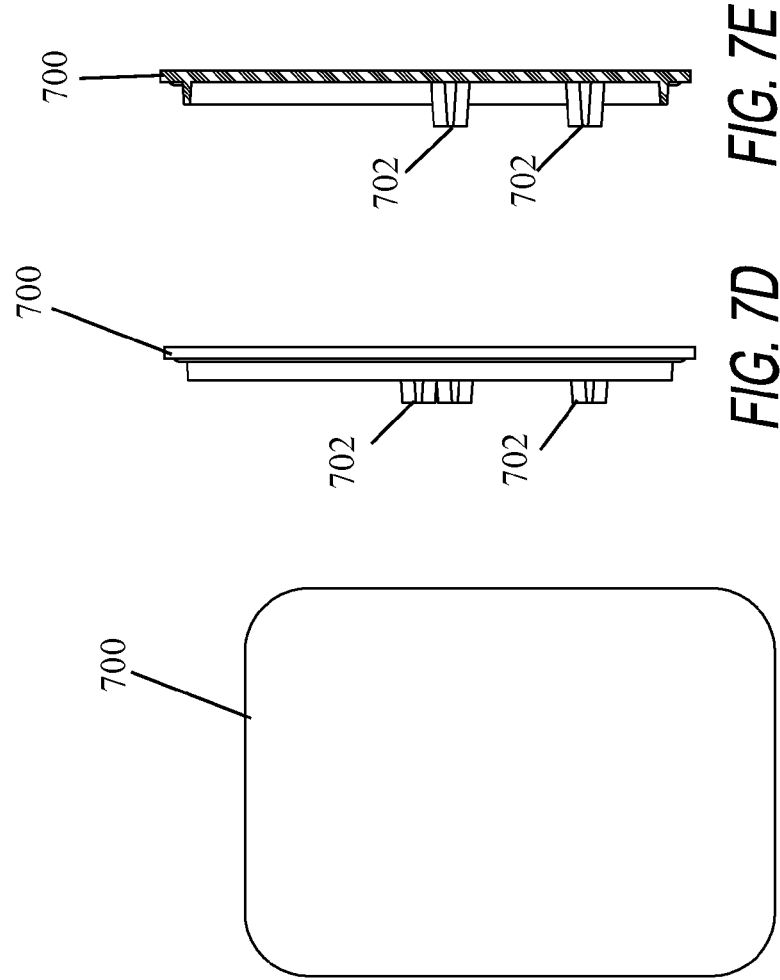
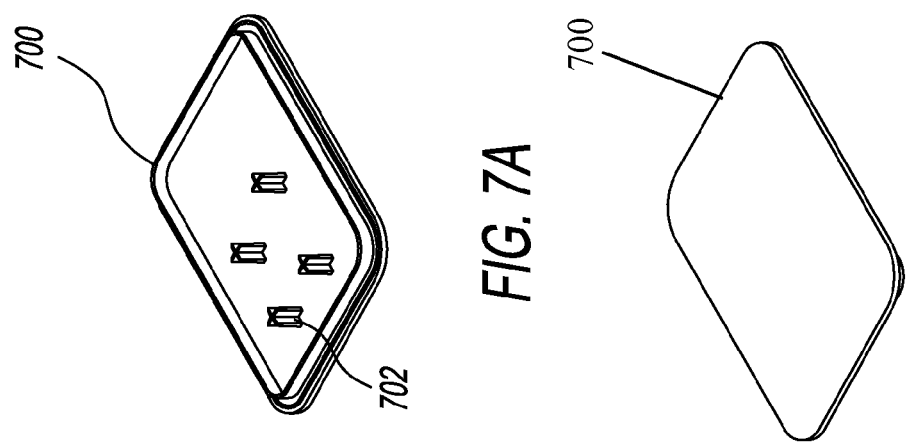

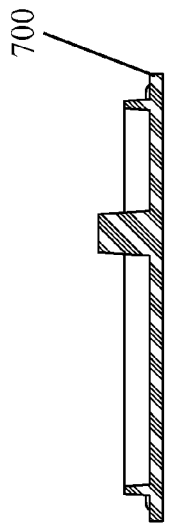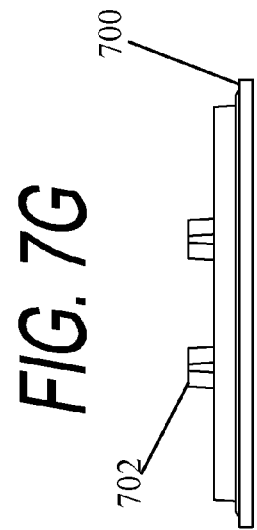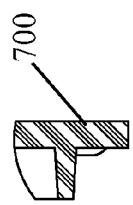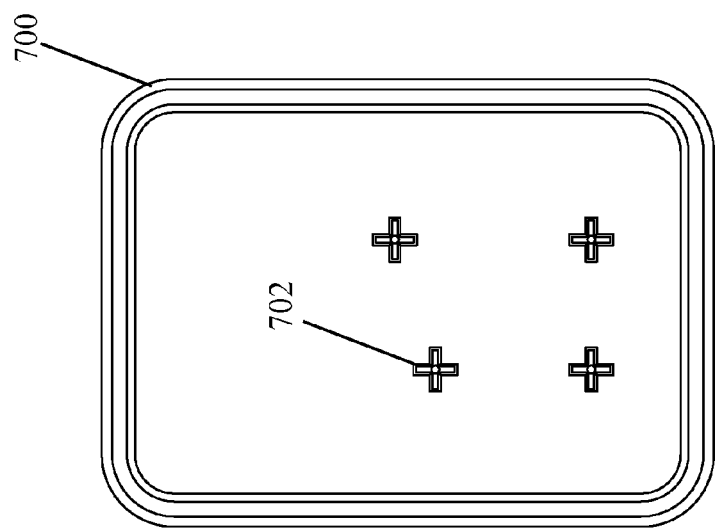
FIG. 7G
FIG. 7H
FIG. 7I
FIG. 7F

CLAMP-ON EASY-INSTALL WIRELESS BATTERY DATA SENSOR AND ASSOCIATED USE THEREOF

This application claims the benefit of U.S. Provisional Application No. 61/805,150, filed Mar. 26, 2013, which is hereby incorporated by reference in its entirety.

BACKGROUND OF THE DISCLOSURE

Technical Field

Exemplary embodiment(s) of the present disclosure relate to industrial lead-acid battery data monitoring apparatus and, more particularly, to a low-cost clamp-on sensor that monitors current, voltage, and battery temperature.

Background of the Invention

A Battery Data Module, hereinafter "BDM", is a system for measuring analog signal parameters continuously from a battery, taking setup configuration information, and storing battery event and data records (e.g., battery current, battery voltage, mid cell battery voltage, battery temperature, electrolyte level, etc.). The BDM will calculate various battery usage parameters and store said values in nonvolatile memory (e.g., read-only memory, flash memory, ferroelectric RAM, magnetic computer storage, etc.) upon the collection of such values.

BDM data can be divided into the following categories: 1) Configuration Data; 2) Summary Data; and 3) Event Data. Configuration Data includes data necessary to manage the operation of the BDM (i.e., battery serial numbers, truck serial numbers, battery configuration, service date, alarm thresholds, conditions). Summary Data is comprised of a plurality of data collected over the operating life of the BDM and optionally over user configurable time intervals. Event Data is a record of operation of the battery to which the BDM is attached. Events are recorded for each operating state of the battery (i.e., battery charge, discharge, idle), BDM start and stop, and event thresholds. Furthermore, event data is used to compile an accurate record of battery use.

The BDM is responsible for collecting data and using the configuration parameters to form these records and store them in nonvolatile memory.

Typical industry software configuration is done locally (i.e., by a direct wired linked connection, by a wireless linked connection) allowing a service technician to configure customer parameters which ultimately provide the configuration and setup of the BDM customized to the battery application. This process is dated and highlights a major weakness in existing BDMs, the necessity to be on-site to configure BDMs for a particular application. The service tech must physically be present in order to properly configure the BDM, so that they can properly enter the pertinent information. When human errors occur in the configuration process, the previously collected data under the erroneous configuration is corrupt and lost. The new configuration must be corrected on the BDM and the newly collected data with the corrected configuration can be tracked moving forward. In essence, configuration needs to be programmed into the BDM before it can properly calculate and form meaningful summary and event data records for the battery on which it resides. Moreover, configuration must be performed locally on-site with proper tools and trained service technicians.

Typical summary and event records are stored locally on the BDM in nonvolatile memory. As mentioned previously, there is a strong relationship between configuration and event and summary records. Embedded in the configuration are various parameters that allow calculating and forming summary and event records. Summary and event data records can then be calculated and formed from these typical parameters. Summary data is a collection of values recorded while the BDM is in operation. Three collections of data are as follows: 1) Total; 2) Interval 1; 3) Interval 2. Total data is a summary of all data recorded since BDM installation. The total data may only be reset by a hard reset of the BDM. Interval 1 and Interval 2 are two sets of data which can be reset by user control. These summary collections can be used to accumulate data over specific time periods of for certain operating conditions.

The BDM event log is a record of all battery activity. A record is entered into the log on each change of operating state (e.g., idle, charging, and discharging). In addition, an event record is generated when the BDM operation is started or stopped. A BDM start event would occur on power-up when the BDM is properly configured and when the BDM is commanded to start via the communications protocol. A stop event occurs when the BDM is commanded to stop via the communications protocol. Loss of power to the BDM will not generate a stop event, however. The BDM can record alarm, status and error events according to the configuration of the device. A plurality of event records is stored in the log in chronological order. When the log is full, the oldest record is overwritten.

The BDM must be a configured intelligent machine in order to calculate and formulate accurate records. Calculated values such as Amper Hours (AHRs), State of Charge (SOC), and time stamped data must be accurate and maintained locally. If the date is not configured properly, the data collected becomes corrupted, and as a result, the BDM's time setting must be corrected to ensure that future data has the proper time stamp. The corrupted data is no longer usable nor salvageable. Likewise, any SOC calculations must possess an accurate battery capacity configuration. Furthermore, any new calculations proposed (i.e., lifetime predictors) must be custom programmed on end devices and added to the protocol.

Exception reporting is primarily the preferred method for existing systems as it only notifies users when there is a warranty-threatening or application issue. Most customers do not want to review records to determine whether there is an issue worth noting. Typically exception reporting will be automated and push alerts via email or text messages. If any records are changed or added, the BDM will require reprogramming. Unfortunately, all devices deployed need to be upgraded individually, which creates service issues and possible loss of data in the module. This does provide a reduction in the amount of data stored, but requires the BDM to perform calculation and event detection methods. Coincidently, this increases the complexity of the embedded controller on the BDM, leading to more potential firmware bugs.

Typical industry hardware is comprised of BDMs that utilize external current sensors and wiring attachments to electrically power the unit from the battery. Typically, the BDM is powered by attaching wires to the positive and negative terminals of the battery or cables attaching to these terminals. These connections are usually light gauge wires and care must be taken when handling batteries, as they can be caught and torn on heavier components of the battery and/or a vehicle (e.g. forklift or pallet truck for material handling) in which the battery is installed when removal and installation on the vehicle occur. Depending on the connection method of these wires, dissimilar metal and acid corrosion can occur on the connectors used. The two methods employed for current sensing are Hall Effects and current shunts.

Hall Effect sensors incorporate a ferrite C-core and need to be electrically powered and sensed via a wiring harness from the BDM. In addition, battery power cables need to be removed from connectors to insert into the C-core of the Hall Effect and then reattached to the connector. Current shunts come in two different varieties: 1) Purchased Calibrated Shunts and 2) Field Calibrated Battery Straps. Purchase calibrated shunts require cutting power cables, applying lugs and attaching to the shunt. Furthermore, wires need to be run back to the BDM for sensing and the shunt needs to be packaged to electrically isolate. Field calibrated shunts eliminate these issues by utilizing existing battery straps that interconnect battery cells and by performing a field calibration procedure to calibrate. Calibration must be done on each install and requires a trained technician, test instruments and setup. The strap cannot be arbitrarily closed and wired to the BDM due to voltage potentials of the BDM sensing circuits. Additionally, the battery may be manufactured with a purchased calibrated shunt, but the shunt must be sized to the BDM used, and therefore becomes custom build with a nonstandard battery strap.

There are other reliability issues related to this special/custom production sequence including shunt dissimilar material, acid corrosion, and heating issues. Consequently, this has not been standardized and due to issues related to this implementation probably will not materialize in the future. Because of these issues and the need for field installs, trained technicians are required to properly install these BDMs. This does not promote nor enable high volume installations and scalability. The cost of ownership is not just the BDM purchase price, but also the cost of installation and resolution of associated human errors that require on-site rectification.

Needs exist for improved systems for monitoring and reporting batter usage.

SUMMARY

It is to be understood that both the following summary and the detailed description are exemplary and explanatory and are intended to provide further explanation of the invention as claimed. Neither the summary nor the description that follows is intended to define or limit the scope of the invention to the particular features mentioned in the summary or in the description. Rather, the scope of the invention is defined by the appended claims.

In certain embodiments, the disclosed embodiments may include one or more of the features described herein. The present invention in embodiments provides for a cost effective and more easily maintained BDM sensor, or "BDS", and clamp. With this new electrical-mechanical method, there is no need to have a special technician to install or replace—regular maintenance personnel can easily perform installations and replacements. This easy-to-install clamp-on configuration may use a tri-axis Hall Effect sensor. The tri-axis Hall Effect sensor may be adapted to use standard battery welding cables from 1 awg to 350 MCM. This is achieved by mechanically designing a PCB with C-channels to house the cables and fix them to piercing pins to provide electrical attachment to the PCB. Copper tacks may be used as the piercing electrical pins, as some typical electronic pins perform poorly for this application. Only a one-time production calibration is required before field installation.

Current sensing typically is the most expensive measurement, utilizing standard Hall Effects or current shunts. This new method achieves a lower cost of ownership model but also decreases the cost of the current sensor hardware and enables easy clamp-on installation that is scalable for high volume production.

Embodiments of a battery data sensor use piercing connector pins in conjunction with mechanical clamping to tap directly into existing battery cables, instead of using wire connectors. Battery cables are typically made of multi-stranded copper wires housed in a flexible neoprene sleeve. The sleeve is flexible to allow for bending of the high gauge wires used. In addition, this sleeve is ⅛" thick to provide necessary insulation and ruggedness required for the cable's ratings. Because of these properties, probes can be inserted into these cables by piercing the outer sleeve of the cable to access the copper strands when measuring voltages of the battery system. The BDS uses the properties of the cable to implement piercing pins integrated into the BDS to clamp onto the wires, which enables the following:

Picking up the battery voltage for measurement and powering the BDS.

Providing a consistent mechanical placement for the Triaxis Hall Effect sensor and the magnetic flux shield for accurate current sensing.

With addition of bottom clamping piece, provides a permanent easy install method.

Battery temperature measurement by the BDS with on-board temperature transducer. This side effect results from the tight clamp-on installation to the cables, which are directly connected to the battery terminals, and the BDS being in the same compartment as the battery.

Providing an easier method to seal the BDS package by not requiring external wires to be routed out.

Some examples of pins that may be used include copper tacks soldered onto the BDS PCB as shown in FIG. 12 and tin-plated custom machines brass pins, such as Keystone Electronics C-14131-NER.

Mechanically clamping the cables in place with C-channels and a mechanical clamping piece provides a known geometry between the cables and the battery data sensor hardware. In conjunction with a magnetic flux shield to provide the necessary magnetic flux concentration, prevent interference and standardize measurement without regard to cable size, the use of a tri-axis Hall Effect sensor for current sensing is made possible (although configuring cable size will increase accuracy, and may be done for example over the Internet after installation, with the configuration settings applied retroactively to previously gathered data for reporting and analysis).

The magnetic flux shield can be made of any material with a high magnetic permeability $\mu_r$ relative to air. Air having a $\mu_r$ of 1 H·m−1, a $\mu_r$ of 10 H·m−1 or higher may be considered high, though many materials have $\mu_r$ of 1,000 H·m−1 or higher. Ferrite materials, such as 48% Ni ferrite for example, function well as magnetic flux shields. A high relative $\mu_r$ ensures concentration of the magnetic flux from the cable within the magnetic flux shield, standardizing the magnetic flux measurement as a simple function of the size of the magnetic flux shield and the current through the cable. Triaxis HE can be calculated using the equation $B=1.25 I/W$, where B is the flux density in mT (milliteslas) at the tri-axis HE sensor, I is the current in amperes through the cable and W is the width in mm of the shield around the current carrying cable. 1.25 mT·mm/A is the magnetic constant. Triaxis HE sensors have a maximum flux density, for example 25 mT. With a 25 mT maximum flux density and a 22 mm shield width, as shown in FIG. 11, a current of up to 440 amps can be reliably measured.

This eliminates the need for cables to be removed from terminals and routed through Hall Effect C-cores, or for shunts which are difficult to calibrate and install and have reliability issues. These changes allow for a very simple installation, with no wire cutting or disconnecting cables or calibrating shunts, and for factory calibration. Installation can therefore be performed by existing personnel with no specialized knowledge, greatly decreasing installation expenses and allowing for installation on a mass scale.

In contrast to existing BDM systems that provide built-in data processing via firmware and require firmware updates and configurations be applied to each device individually, with accompanying high service time and installation difficulty, the BDS of the present invention in embodiments stores only raw data for periodic transmission. All configuration and processing may be performed off-site at a single cloud system for processing and reporting. A user can configure their options on the server application via the web, and aggregated BDS data (old and new) can be re-calculated and updated for new reporting, essentially eliminating the need to reprogram affected BDS units in the field. Continuous updates can therefore be made to the software at little cost. Users can easily change their processing and reporting preferences for their various units via their computer, etc., without having to physically go to each device and configure each one manually. Configuration and processing changes can be applied retroactively to previously collected data, something that is impossible in prior art systems.

A new battery data sensor apparatus may include a clamping structure having first and second mechanical clamping portions, a cable guide attached to the clamping structure and configured to limit lateral movement of a cable positioned within the cable guide, a printed circuit board attached to the clamping structure, a tri-axis Hall Effect sensor mounted on the printed circuit board and positioned adjacent to the cable guide when the first and second mechanical clamping portions are clamped together to sense a current flowing through the cable positioned within the cable guide, an electrical power pin electrically connected to the printed circuit board and projecting into the space within the cable guide and configured to pierce the cable positioned within the cable guide to provide an electrical connection to the cable, a processor electrically connected to the printed circuit board and configured to analyze signals from the tri-axis Hall Effect sensor, and a magnetic flux shield configured to wrap around the cable positioned within the cable guide when the first and second mechanical clamping portions are clamped together, and not to come between the tri-axis Hall Effect sensor and the cable positioned within the cable guide. The first and second mechanical clamping portions may be configured to be clamped together to secure the cable positioned within the cable guide and prevent movement of the cable relative to the tri-axis Hall Effect sensor.

All the components may be attached to one or the other of the first and second mechanical clamping portions, such that when the mechanical clamping portions are clamped around a battery cable, all components are appropriately positioned with respect to the cable. Alternatively, some or all components may be attached to intermediate structures that are themselves clamped into place by the clamping portions, or are otherwise secured in the appropriate position. Because the cable guide contains the cable when the mechanical clamping portions are clamped around the cable, the location where the cable will be within the clamped battery data sensor assembly can be known accurately in advance, allowing for appropriate component positioning.

The cable guide may be shaped to wrap around a cable and limit its movement in several directions, for example it may be an extruded U or C shape and substantially surround the cable on three sides, leaving one open side for insertion of the cable without removing it from the battery to which its end is attached. The open side may then be closed by clamping one of the mechanical clamping portions against the cable guide, which may for example be attached to the other mechanical clamping portion. Alternatively, the cable guide may be hinged and open to allow insertion of the cable, and may be secured by a snap or other connection when the hinge is swung closed. In embodiments, the cable guide may be formed by separate elements of each of the clamping portions when the clamping portions are secured together. For example, one vertical wall might extend from each of top and bottom clamping portions, and when clamped together the two vertical walls may form the side walls and the surface of the clamping portion may form the top and bottom walls of a rectangular cable guide. Many other shapes and arrangements may be utilized. The cable guide may be sized for the particular cable or a particular range of cable sizes with which the cable guide is to be used, to limit movement of the cable within the cable guide and ensure the cable can fit inside the cable guide, or may be sized to fit the largest common battery cable in use with smaller cables allowed to move to some extend within the cable guide.

Electrical power pins also serve to restrict movement of battery cables with respect to the battery data sensor assembly. To this purpose, any number and arrangement of electrical power pins may be used, for example electrical power pins on either side (e.g. at the opening and closing) of each cable guide. The electrical power pins may be attached to the printed circuit board and stick through the cable guide into the center of the area within the cable guide to pierce and fix the cable. The electrical power pins may be located to the side of the magnetic flux shield so as not to interfere with the current measurement of the tri-axis Hall Effect sensor.

The magnetic flux shield may be shaped and positioned to surround most of the cable, leaving an open side where the tri-axis Hall Effect sensor is positioned. The processor may be configured to carry out various functionality in addition to analyzing the signals from the tri-axis Hall Effect sensor. For example, the processor may send data to a display, either local or remote, for viewing by an operator, and/or to a storage location and/or for further processing, may operate an alarm, may query the operational status of the various components, etc. The magnetic flux shield may be mounted to one of the clamping portions and extend into and/or through the other clamping portion, which may have the tri-axis Hall Effect sensor mounted thereon, and the tri-axis Hall Effect sensor may be located within the magnetic flux shield (e.g. between two legs of the shield) when the two mechanical clamping portions are clamped together.

In embodiments, the cable guide is U-shaped and connected to the printed circuit board. The printed circuit board is attached to one of the first and second mechanical clamping portions having a housing protecting the printed circuit board, the magnetic flux shield is U-shaped and attached to the other of the first and second mechanical clamping portions and positioned such that it covers the open end and sides of the channel guide. The cable positioned within the cable guide is clamped between the cable guide and the magnetic flux shield and the tri-axis Hall effect sensor is positioned within the open end of the magnetic flux shield when the first and second mechanical clamping portions are clamped together. The first and second mechanical clamping portions have aligned holes such that the mechanical clamping portions can be securely clamped to each other with nuts and bolts. In embodiments, the first and second mechanical clamping portions may have a hinged connection on one edge, and only one bolt and nut pair is required to clamp the mechanical clamping portions together on the edge opposite the hinged connection. In other embodiments, various numbers of bolts/nuts or other fasteners may be used to clamp the portions together. In some embodiments, the two mechanical clamping portions may be hinged at one edge and snap closed, for example at the opposite edge and/or other edges, or the mechanical clamping portions may simply snap or clip together. In such embodiments, the piercing pins may be relied on to a greater extent to fix the cables within the battery data sensor, and more pins for example may be used for that reason.

In embodiments, the processor is powered by electrical energy from a battery connected to the cable positioned within the cable guide. The processor may determine the voltage of the battery and determine the current running through the cable positioned within the cable guide using the signals from the tri-axis Hall Effect sensor.

In embodiments, there is a temperature transducer electrically connected to the processor, and the processor is configured to measure the temperature of the battery.

In embodiments, the battery data sensor includes a second cable guide configured to limit lateral movement of a second cable positioned within the second cable guide and includes a second electrical power pin projecting into the space within the second cable guide and configured to pierce the second cable positioned within the second cable guide to provide an electrical connection to the second cable. Often, separate positive and negative battery cables will be connected to the battery, and the operator will want the battery data sensor to tap into both. Only one tri-axis Hall Effect sensor is necessary, adjacent to either cable, and therefore only one magnetic flux shield may be needed, to concentrate magnetic flux for the tri-axis Hall Effect sensor. For the other cable guide, the mechanical clamping portion not connected to that cable guide may have a portion that presses against the top of the cable positioned within to clamp it in place.

A new method of using the battery data sensor apparatus includes positioning a battery cable connected to a battery within the cable guide and piercing the battery cable with the electrical power pin, clamping the first and second mechanical clamping portions together around the battery cable by inserting bolts through the aligned holes and securing them with nuts, measuring the voltage of the battery connected to the battery cable and the current through the battery cable using the processor, and transmitting the voltage and current readings to a display. The display may be local, such as an LED screen or other readout attached to the clamping structure, and/or remote, such as an LED screen or other readout at a remote operator station and/or a website or other network portal. Various other data may be generated by the processor and transmitted similarly, using for example a transceiver or transmitter.

A new battery data sensor apparatus includes a cable guide configured to restrict the movement of a cable positioned within the cable guide, an electrical power pin configured to pierce the cable positioned within the cable guide to provide an electrical connection to the cable, a tri-axis Hall Effect sensor configured to sense a current flowing through the cable positioned within the cable guide, and a clamping structure configured to clamp the cable positioned within the cable guide and prevent movement of the cable relative to the tri-axis Hall Effect sensor.

The battery data sensor in embodiments may include a printed circuit board attached to the clamping structure, where the electrical power pin is electrically connected to the printed circuit board.

In embodiments, a magnetic flux shield may wrap around the clamped cable positioned within the cable guide when the cable is clamped. The magnetic flux shield does not come between the tri-axis Hall Effect sensor and the cable positioned within the cable guide. The magnetic flux shield may provide magnetic flux concentration for the tri-axis Hall Effect sensor, standardize a current measurement by the tri-axis Hall Effect sensor, and prevent interference from other current carrying devices.

In embodiments, the tri-axis Hall effect sensor may be positioned on the printed circuit board.

In embodiments, the battery data sensor may also include a processor, and the processor is configured to analyze signals from the tri-axis Hall Effect sensor. The processor may be powered via the electrical power pin by electrical energy from a battery connected to the cable positioned within the cable guide. The processor may be configured to determine the voltage of the battery, and to determine the current running through the cable positioned within the cable guide using the signals from the tri-axis Hall Effect sensor. A temperature transducer may be electrically connected to the processor, and the processor may be configured to measure the temperature of the battery.

In embodiments, the clamping structure includes first and second mechanical clamping portions configured to be clamped together to clamp the cable within the cable guide.

In embodiments, the tri-axis Hall Effect sensor is mounted on the printed circuit board and positioned adjacent to the cable guide when the clamping structure is clamping the cable.

In embodiments, the electrical power pin projects into the space within the cable guide.

In embodiments, the cable guide may be U-shaped and attached to one of the first and second mechanical clamping portions, the magnetic flux shield may be U-shaped and attached to the other of the first and second mechanical clamping portions and positioned such that it covers the open end and sides of the channel guide, and the cable positioned within the cable guide may be clamped between the cable guide and the magnetic flux shield when the mechanical clamping portions are clamped together around the cable.

The first and second mechanical clamping portions may have aligned holes such that the mechanical clamping portions can be securely clamped to each other with nuts and bolts.

These and further and other objects and features of the invention are apparent in the disclosure, which includes the above and ongoing written specification, with the drawings.

BRIEF DESCRIPTION OF THE DRAWINGS

The novel features believed to be characteristic of the exemplary embodiment(s) are set forth with particularity in the appended claims. The disclosure itself, however, both as to its organization and method of operation, together with further objects and advantages thereof, may best be understood by reference to the following description taken in connection with the accompanying drawings in which:

The figures generally include various perspective/elevational view(s) showing a robust, low-cost, easy to install battery sensor, in accordance with non-limiting exemplary embodiment(s) of the present disclosure.

FIG. 3 illustrates a side view of the exemplary embodiment of FIGS. 1 and 2 incorporating various battery sensor components of the present disclosure.

FIGS. 5A-5J illustrate perspective, top, bottom, side, front, sectional and detail views of a mechanical clamping portion having dual cable guides, in an embodiment.

FIGS. 6A-6J illustrate perspective, top, bottom, side, front, rear, and sectional views of a mechanical clamping portion, in an embodiment.

FIGS. 7A-7I illustrate perspective, top, side, front, sectional, and detail views of a mechanical clamping portion cover, in an embodiment.

DETAILED DESCRIPTION

Figure 1:
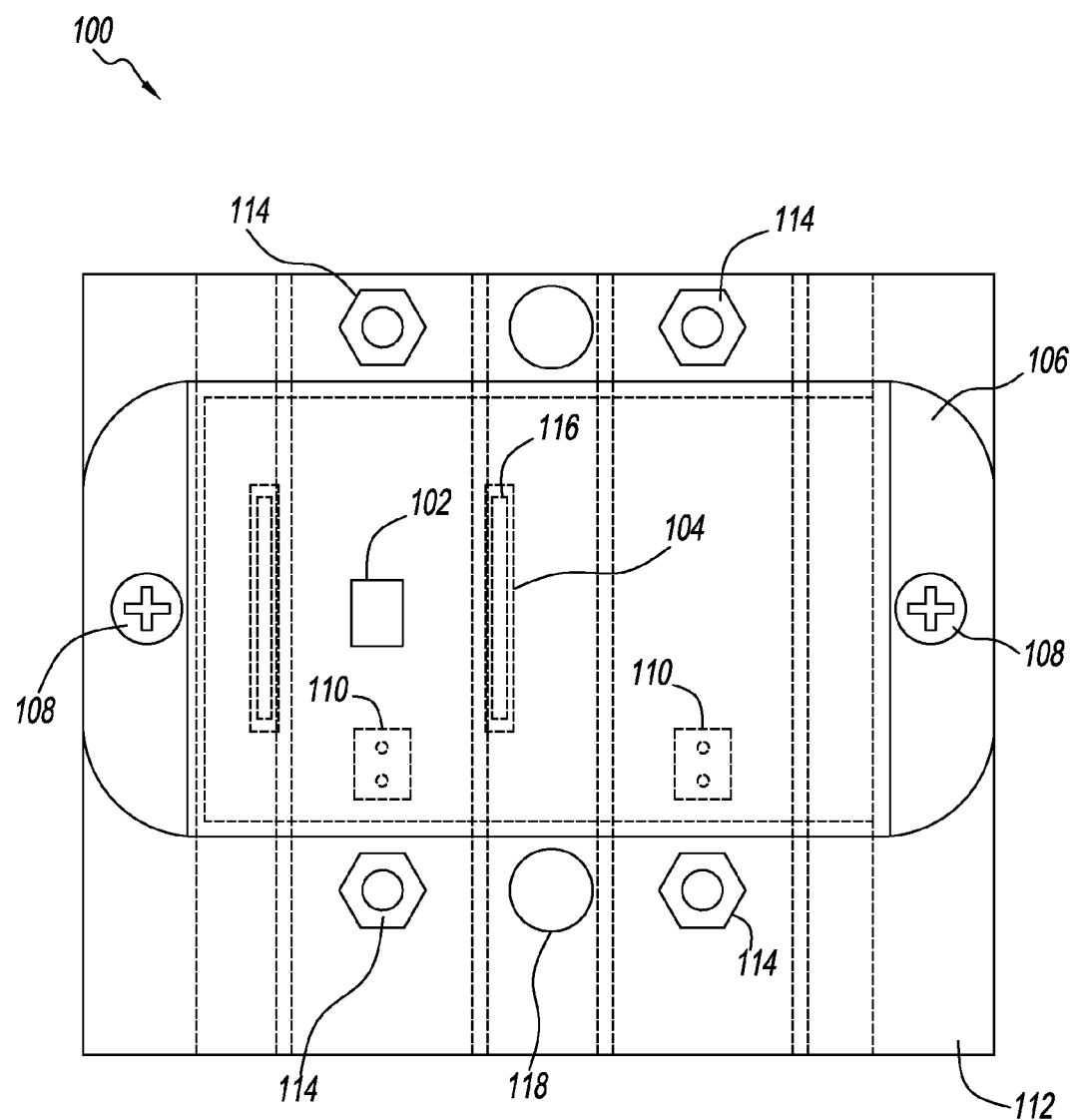
FIG. 1 illustrates the top view of an exemplary embodiment incorporating various battery sensor components of the present disclosure.

The non-limiting exemplary embodiment(s) will now be described more fully hereinafter with reference to the accompanying drawings, in which a preferred embodiment of the disclosure is shown. Such exemplary embodiment(s) may, however, be embodied in many different forms and should not be construed as limited to the embodiment set forth herein. Rather, these embodiment(s) are provided so that this application will be thorough and complete, and will fully convey the true scope of the disclosure to those skilled in the art.

The below disclosed subject matter is to be considered illustrative, and not restrictive, and any appended claim(s) are intended to cover all such modifications, enhancements, and other embodiment(s) which fall within the true scope of the non-limiting exemplary embodiment(s). Thus, to the maximum extent allowed by law, the scope of the non-limiting exemplary embodiment(s) is to be determined by the broadest permissible interpretation of the claim(s) and their equivalents, and shall not be restricted or limited by the foregoing detailed description.

References in the specification to "an exemplary embodiment", "an embodiment", "a preferred embodiment", "an alternative embodiment" and similar phrases mean that a particular feature, structure, or characteristic described in connection with the embodiment(s) is included in at least an embodiment of the disclosure. The appearances of the phrase "a non-limiting exemplary embodiment" in various places in the specification are not necessarily all meant to refer to the same embodiment.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items. As used herein, the singular forms "a", "an" and "the" are intended to include the plural forms as well, unless the context clearly indicates otherwise.

"Tri-Axis Hall Effect Sensor" as used herein refers to an innovative magnetic sensor technology capable of 3 axis magnetic field measurement from a single sensor. The Tri-axis technology allows one to measure the position of a magnet very precisely. Furthermore, it can be used to measure rotational, linear and 3D displacement as well as sense current flowing in a wire. Such sensors are known in the art and may be constructed by adding an integrated magnetic concentrator made of soft ferromagnetic material to the surface of a Hall IC, causing part of the flux lines to pass through the chip underneath the gap between surface lateral Hall elements, causing the Hall elements to "see" a vertical magnetic field going down on one side and up on the other. Sensor output may then be generated by substracting the output voltages of the two Hall elements.

"Printed Circuit Board", hereinafter PCB, may be a device used to mechanically support and electrically connect electronic components using conductive pathways, tracks or signal traces etched from copper sheets laminated onto a non-conductive substrate.

Referring now to FIG. 1, a top view 100 of an exemplary embodiment incorporating various battery sensor components of the present disclosure is depicted. At 102, the Tri-axis Hall Effect sensor is shown. The Tri-axis Hall Effect sensor 102 is capable of high temperature operation and can include sophisticated bus and interface electronics directly on chip. The magnetic coupling of Hall Effect sensor 102 means no physical contact and no wear items for virtually indefinite life. At 104, available slots for the magnetic flux shield 116 are shown on the Printed Circuit Board ("PCB"). A magnetic flux shield 116 provides magnetic flux concentration for Tri-axis Hall Effect sensor 102, standardizes the current measurement regardless of cable size, and prevents interference from other current carrying devices. Top housing 106 protects electronic components inside. Bolts 108 fix top 112 and bottom mechanical clamping pieces. Electrical power pins 110 pierce and provide an electrical connection to battery cables. Nut/bolt combinations 114 connect cable guides to top mechanical clamping piece 112. Holes 118 provide an optional auxiliary mounting reinforcement. A zip tie, for example, can be run through these holes and tightened around the BDS assembly to keep the electrical power pins tight and reinforce the mechanical assembly overall.

Figure 2:
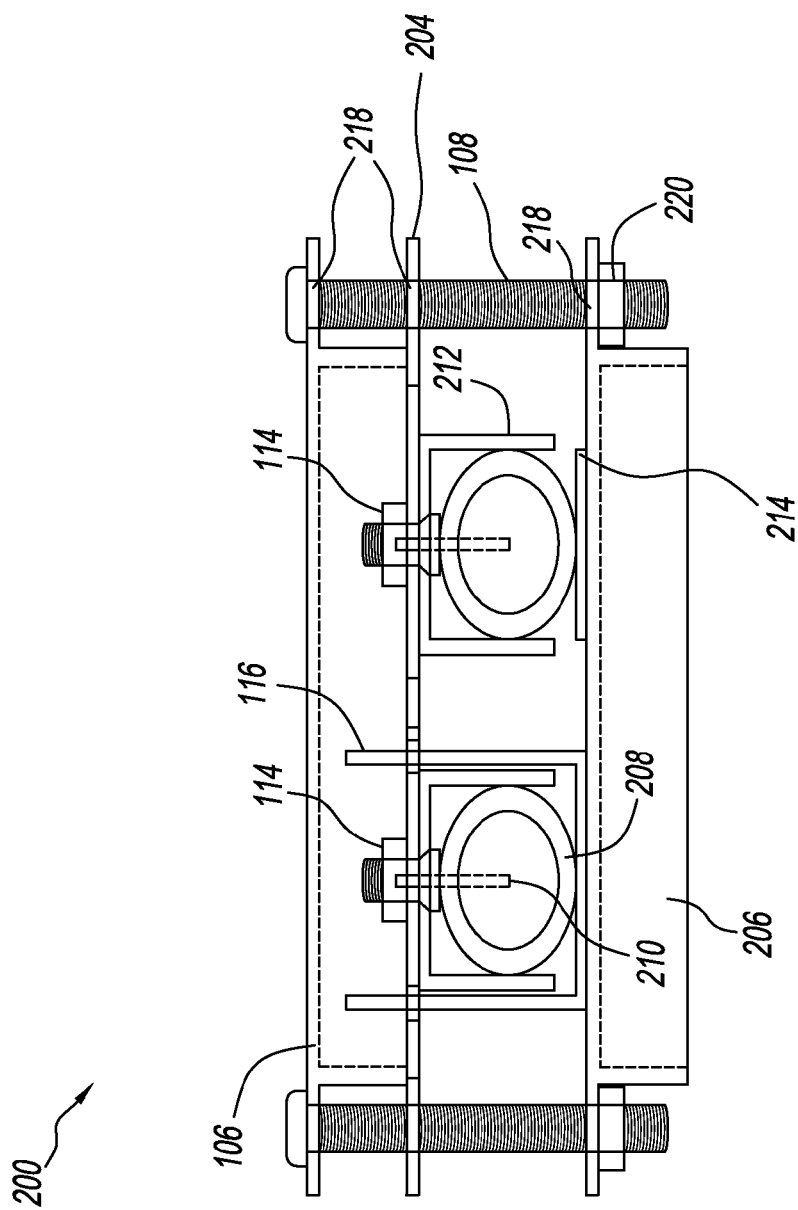
FIG. 2 illustrates the front view of the exemplary embodiment of FIG. 1 incorporating various battery sensor components of the present disclosure.

Referring now to FIG. 2, a front view 200 of the exemplary embodiment incorporating various battery sensor components of the present disclosure is depicted. At 204, the PCB battery sensor is shown. The PCB battery sensor 204 is adapted to use standard battery welding cables 208 ranging in diameter between 1 awg and 350 MCM. The PCB has been mechanically designed with a plurality of C-channels cable guides 212 to house battery cables 208 and fix them to piercing electrical power pins 210 to provide electrical attachment to the PCB. In 206, a mechanical plate is depicted. Mechanical plate 206 is attached to the PCB assembly to provide clamping action to align battery cables 208 and magnetic flux shield 116 strategically under the Tri-axis current sensor and maintain the electrical connection between the PCB and battery cables 208 via power pins 210. Magnetic flux shield 116 is placed in between mechanical plate 206 and the battery cables 208 and around cables 208 and C-channels 212 to enclose the battery cables 208 and extend through the slots 104 provided in the PCB. Spacer 214 has approximately the same thickness as magnetic flux shield 116, preventing the BDS from being lop-sided when clamped together. Aligned holes 218 allow bolt 108 and nut 220 to secure top and bottom mechanical clamping pieces 112, 206.

Due to this new clamping assembly, piercing electrical power pins 210 can be mounted on the PCB of the battery sensor 204 to provide circuit power without running wires and connectors. This adapted mechanical-electrical implementation provides a low-cost, easy to install battery sensor.

Referring now to FIG. 3, a side view 300 of the exemplary embodiment incorporating various battery sensor components of the present disclosure is depicted. At 212, the C-channel cable guides are shown. At 106, a top housing/cover is shown. The top cover/housing 106 may cover the PCB to protect it from the elements.

Figure 4A:
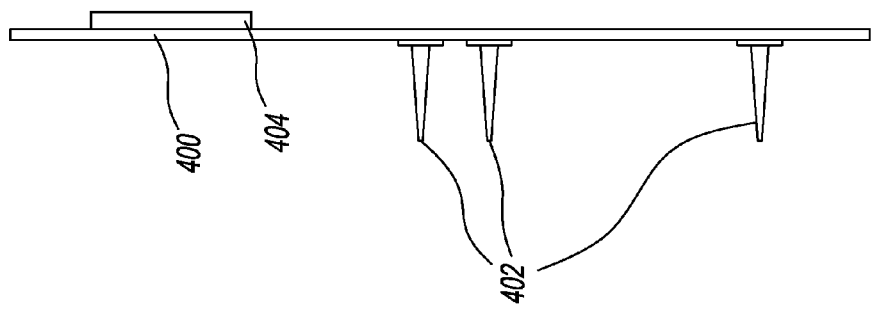
FIGS. 4A-4B illustrate side and top views of a PCB with electrical power pins, respectively, in an embodiment.
Figure 4B:
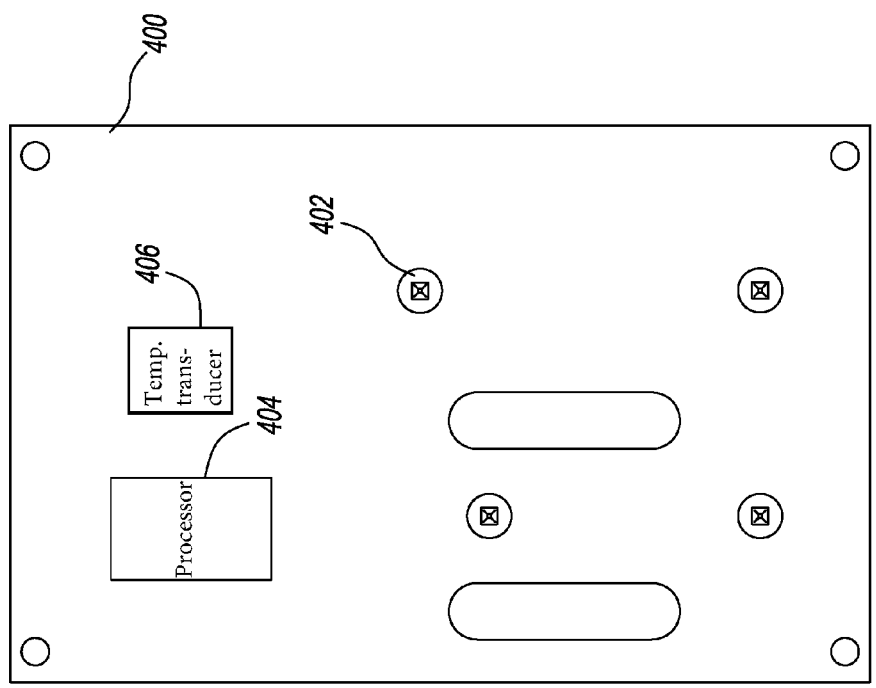

FIG. 4A is a top view and FIG. 4B a top view of a PCB 400 with electrical power pins 402. Processor 404 and temperature transducer 406 are also connected to the PCB in this embodiment.

Figure 5E:
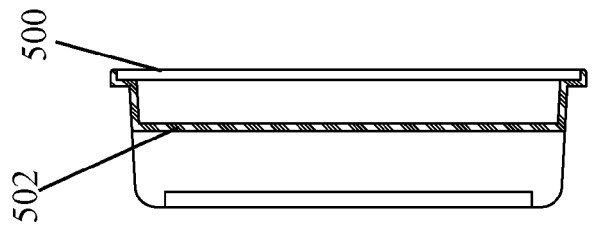
Figure 5D:
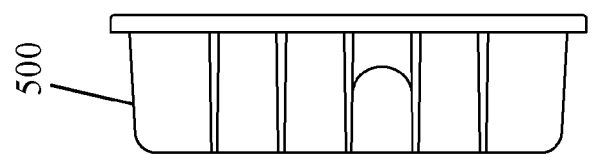
Figure 5C:
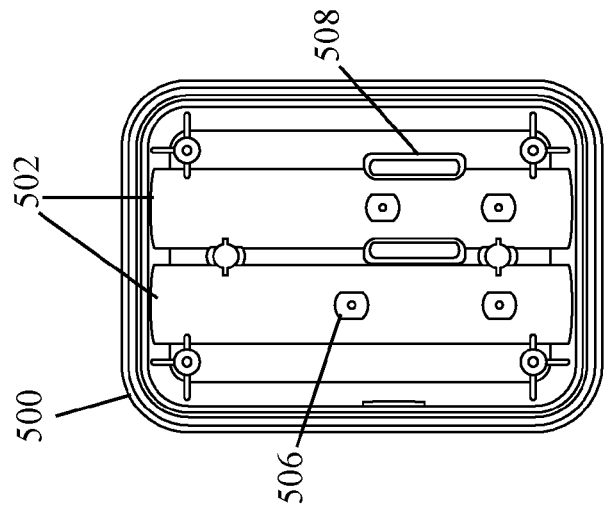
Figure 5A:
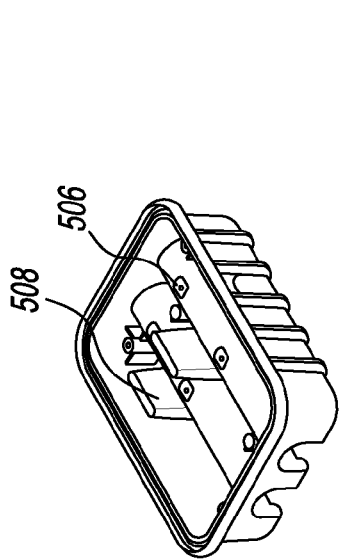
Figure 5B:
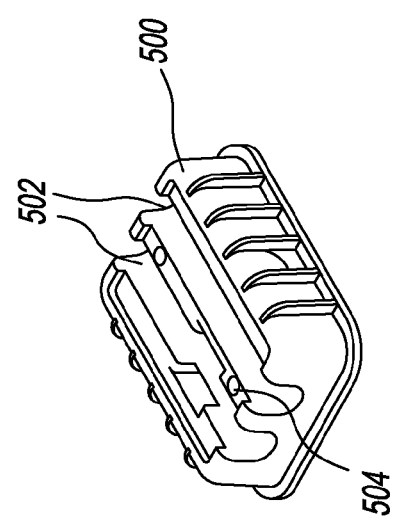

FIG. 5A is a bottom perspective, FIG. 5B a top perspective, FIG. 5C a bottom view, FIG. 5D a side view, FIG. 5E a side sectional view, FIG. 5F a top view, FIG. 5G a front sectional view, FIG. 5H a front sectional view, FIG. 5I a front view, and FIG. 5J a detail view of a mechanical clamping portion 500 having dual cable guides 502, holes 506 for passage of electrical power pins and slots 508 for passage of magnetic flux shield sides, in an embodiment.

Figure 6C:
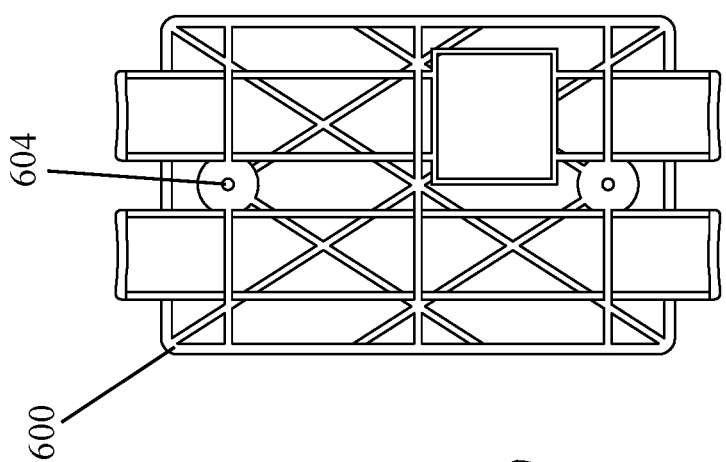
Figure 6B:
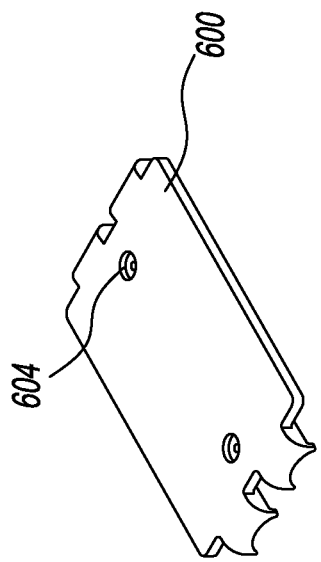
Figure 6A:
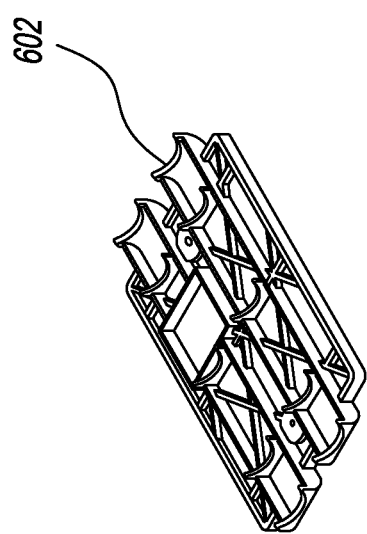

FIG. 6A is a bottom perspective, FIG. 6B a top perspective, FIG. 6C a bottom view, FIG. 6D a side sectional view, FIG. 6E a side sectional view, FIG. 6F a side view, FIG. 6G a front sectional view, FIG. 6H a top view, FIG. 6I a front sectional view, and FIG. 6J a rear view of a mechanical clamping portion 600 having holes 604 for clamping bolts, in an embodiment.

FIG. 7A is a top perspective, FIG. 7B a bottom perspective, FIG. 7C a bottom view, FIG. 7D a side view, FIG. 7E a side sectional view, FIG. 7F a top view, FIG. 7G a front sectional view, FIG. 7H a front view, and FIG. 7I a detail view of a mechanical clamping portion cover 700 having spacers/reinforcers 702 for supporting the PCB 400 where the electrical power pins 402 are attached and will push against the PCB as they pierce the battery cables, in an embodiment.

Figure 8:
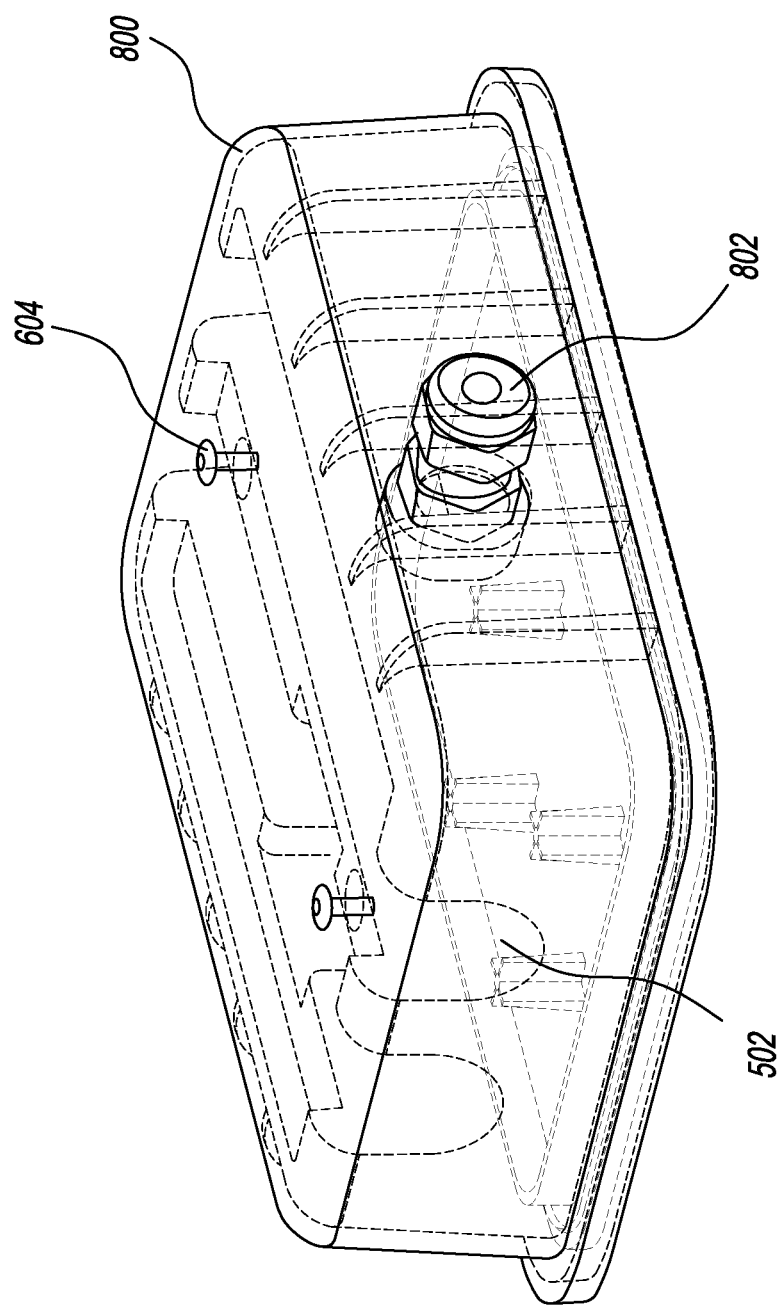
FIG. 8 illustrates a perspective view of an assembled battery data sensor, in an embodiment.

FIG. 8 illustrates a perspective view of an assembled battery data sensor 800 with port 802, in an embodiment. Port 802 may be used to wire in additional features such as electrolyte sensing, additional cell voltages, and/or a battery mounted temperature transducer. Other embodiments may exclude this port 802.

Figure 9:
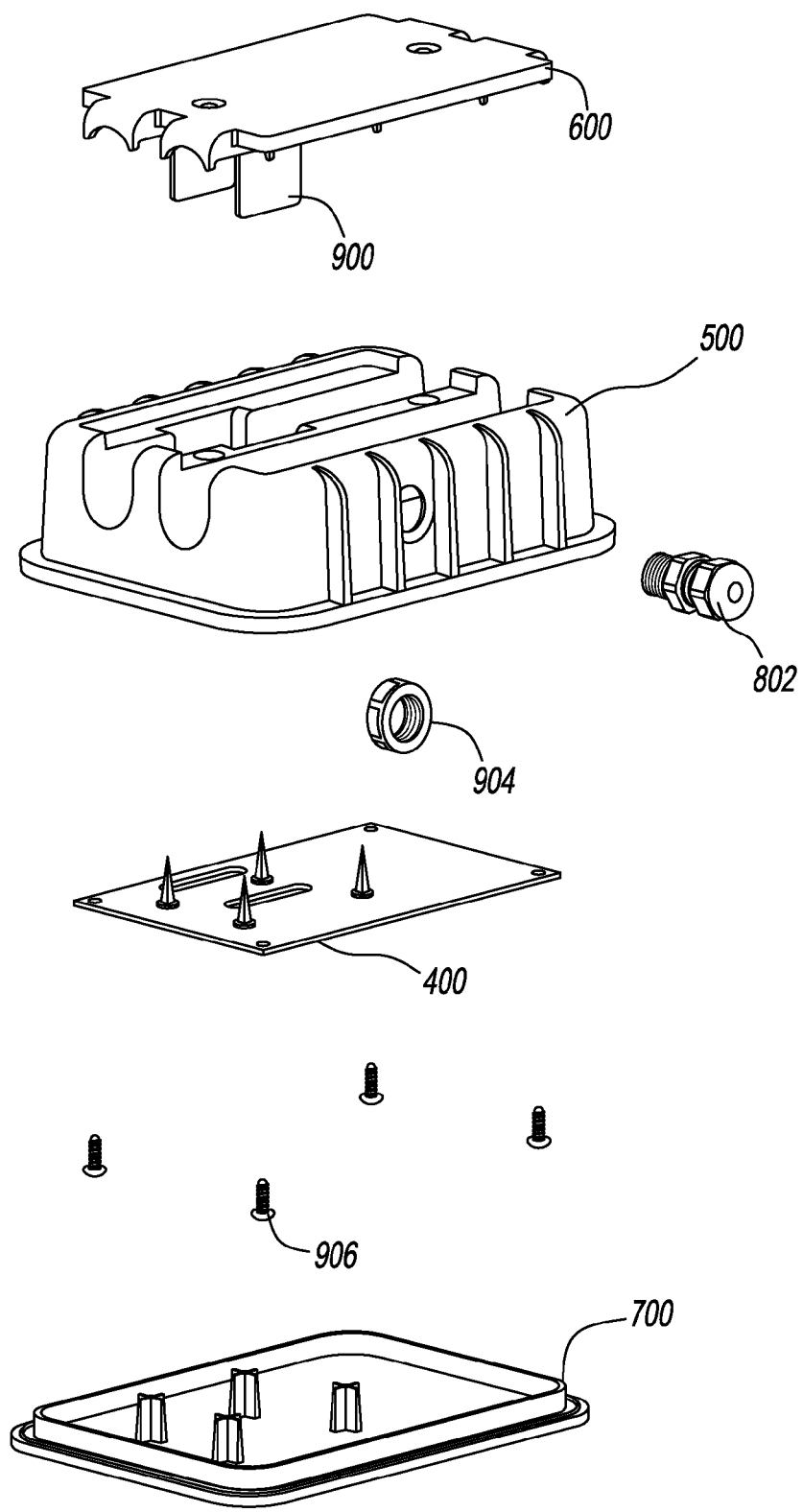
FIG. 9 illustrates an exploded view of an assembled battery data sensor, showing the positioning of the two clamping portions, printed circuit board with electrical power pins, clamping portion cover, fasteners and data port, in an embodiment.

FIG. 9 illustrates an exploded view of an assembled battery data sensor 800, showing the positioning of the two clamping portions 500, 600, printed circuit board 400 with electrical power pins, clamping portion cover 700, magnetic flux shield 900, fasteners 906 and data port 802, and data port attachment nut 904, in an embodiment.

Figure 10:
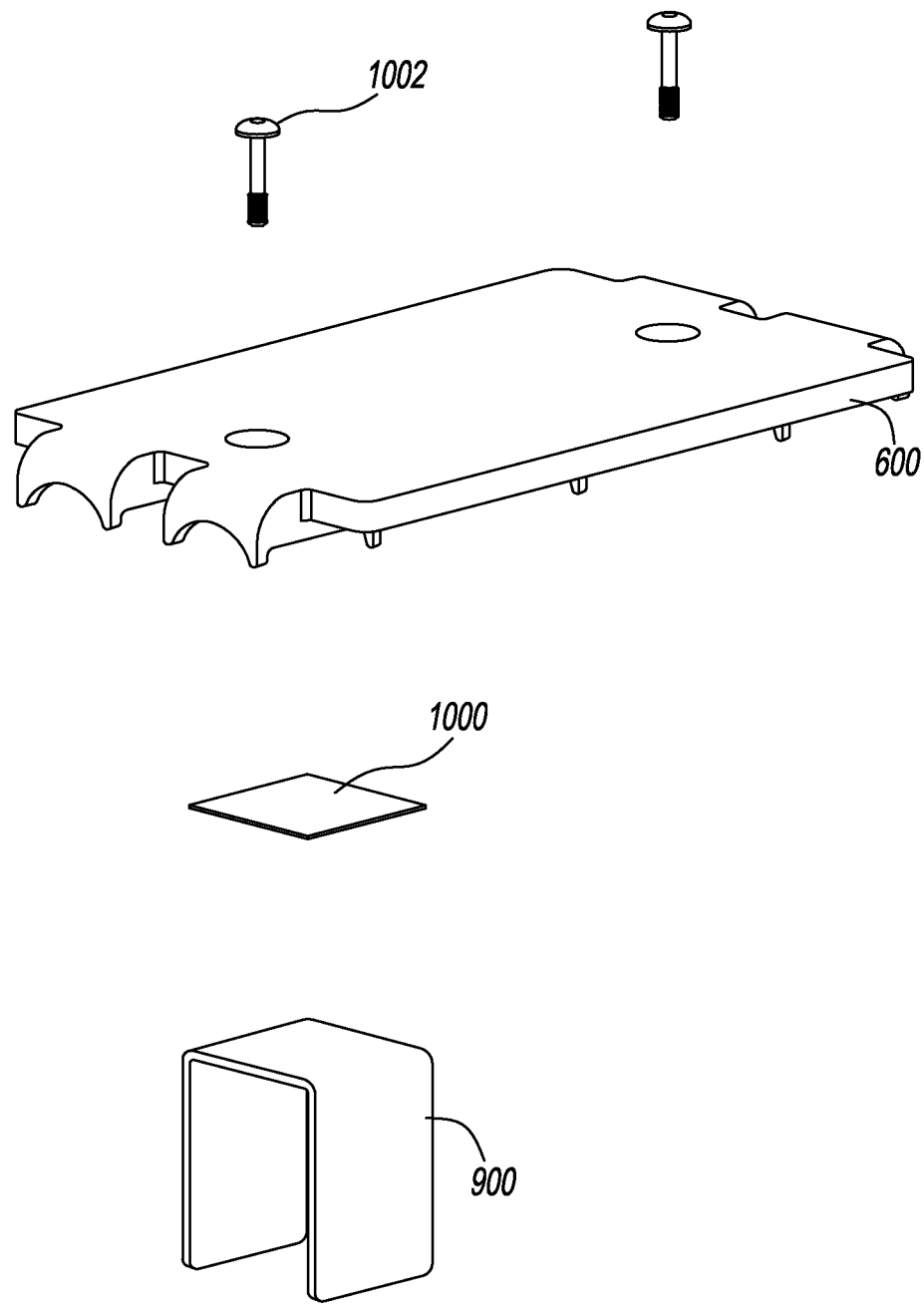
FIG. 10 illustrates an exploded view of the mechanical clamping portion of FIGS. 6A-6J, magnetic flux shield, adhesive and fasteners, in an embodiment.

FIG. 10 illustrates an exploded view of the mechanical clamping portion 600 of FIGS. 6A-6J, magnetic flux shield 900, adhesive (e.g. tape) 1000 and fasteners 1002 (for extending through holes 604 into holes 504 to clamp together top and bottom clamping portions 500, 600), in an embodiment. Holes 504 of clamping porting 500 has threaded inserts to receive the fasteners 1002 and clamp clamping portions 500 and 600.

Figure 11:
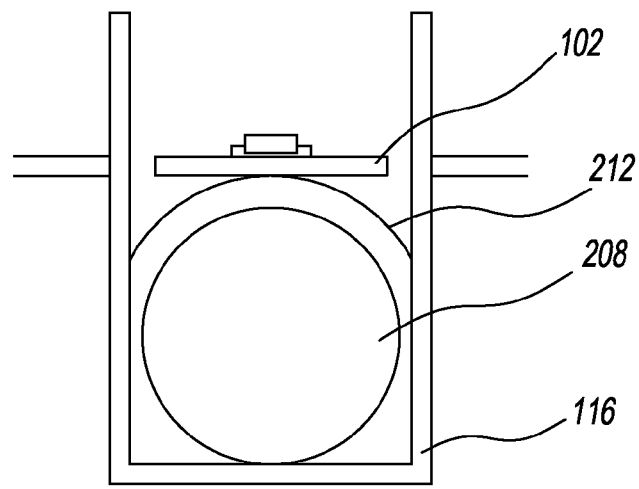
FIG. 11 illustrates a cross-section of a cable, ferrite shield and tri-axis Hall Effect Sensor, in an embodiment.

FIG. 11 illustrates a cross-section of a cable 208, ferrite shield 116 and tri-axis Hall Effect Sensor 102, with cable guide 212. In this arrangement and geometry of components, with a 25 mT maximum flux density for the Hall Effect sensor, a current of up to 440 amps can be reliably measured as discussed above.

Figure 12:
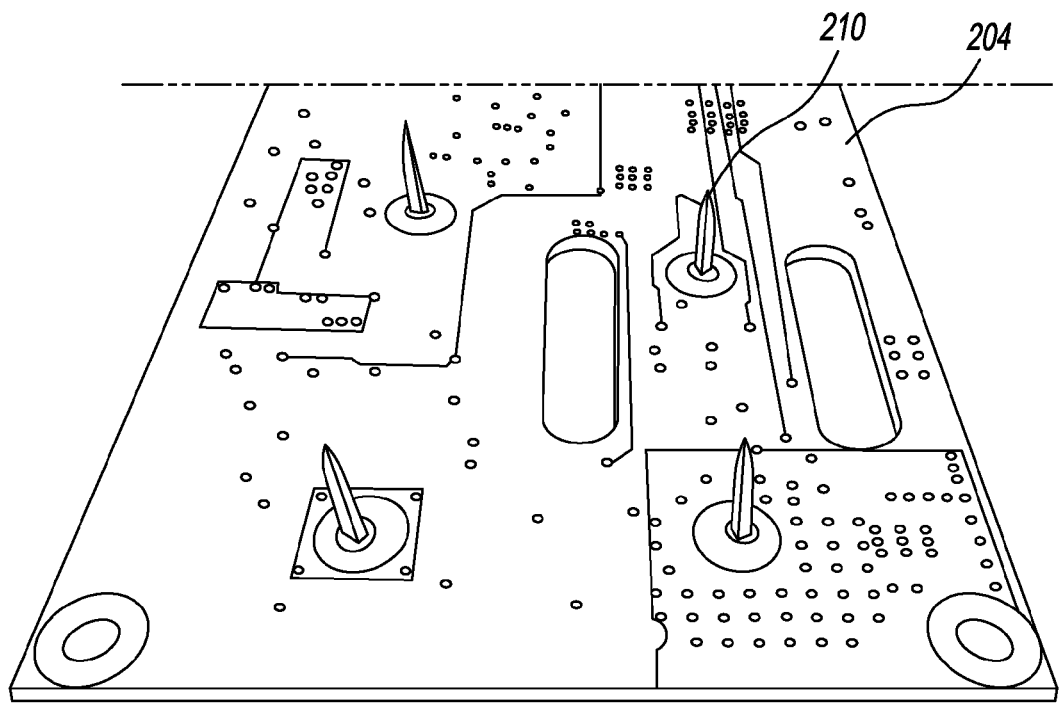
FIG. 12 illustrates a PCB with soldered brass tacks, in an embodiment.

FIG. 12 illustrates a PCB 204 with soldered brass tacks 210 used as electrical power pins.

Figure 13:
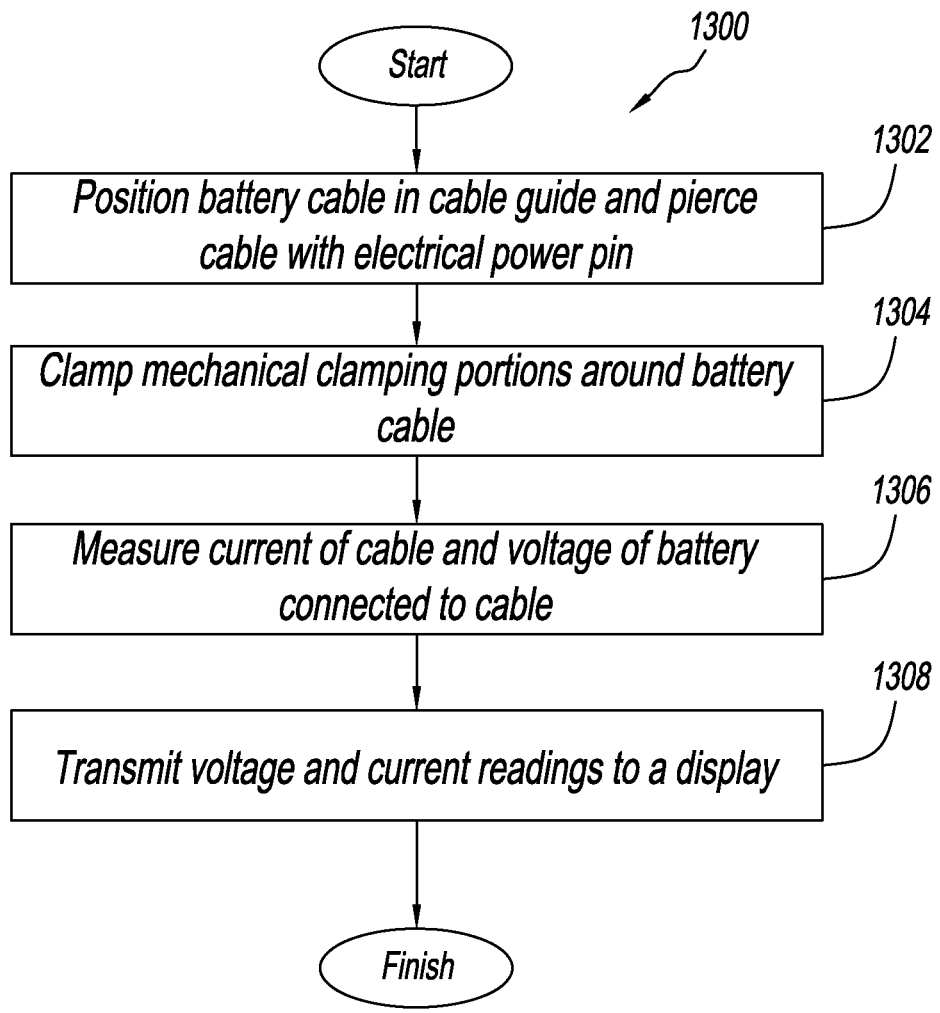
FIG. 13 illustrates a method of using a battery data sensor, in an embodiment.

FIG. 13 illustrates a method 1300 of using a battery data sensor, in an embodiment. At step 1302 a battery cable is positioned in the cable guide and pierced with the electrical power pin(s). At step 1304, the mechanical clamping portions are clamped around the battery cable to secure it within the BDS. At step 1306, the current of the cable is measured using the tri-axis Hall Effect sensor, and the voltage of the battery connected to the cable is measured based on the electrical connection provided by the electrical power pin(s). At step 1308, the measured voltage and current readings are transmitted to a display, which may be local and/or remote to the BDS.

It is noted the purpose of the abstract is to enable the U.S. Patent and Trademark Office and the public generally, especially the scientists, engineers and practitioners in the art who are not familiar with patent or legal terms or phraseology, to determine quickly from a cursory inspection the nature and essence of the technical disclosure of the application. The abstract is neither intended to define the disclosure of the application, nor is it intended to be limiting as to the scope of the disclosure in any way.

The invention is not limited to the particular embodiments illustrated in the drawings and described above in detail. Those skilled in the art will recognize that other arrangements could be devised, for example, Examples. The invention encompasses every possible combination of the various features of each embodiment disclosed. One or more of the elements described herein with respect to various embodiments can be implemented in a more separated or integrated manner than explicitly described, or even removed or rendered as inoperable in certain cases, as is useful in accordance with a particular application While the invention has been described with reference to specific illustrative embodiments, modifications and variations of the invention may be constructed without departing from the spirit and scope of the invention as set forth in the following claims. In particular, with respect to the above description, it is to be realized that the optimum dimensional relationships for the parts of the exemplary embodiment(s) may include variations in size, materials, shape, form, function and manner of operation.

I claim:
1. A battery data sensor apparatus, comprising:
a cable guide configured to restrict the movement of a cable positioned within the cable guide;
an electrical power pin configured to pierce the cable positioned within the cable guide to provide an electrical connection to the cable;

a tri-axis Hall Effect sensor configured to sense a current flowing through the cable positioned within the cable guide;
a clamping structure configured to clamp the cable positioned within the cable guide and prevent movement of the cable relative to the tri-axis Hall Effect sensor; and
a processor, wherein the processor is configured to analyze signals from the tri-axis Hall Effect sensor;
wherein the processor is configured to be powered via the electrical power pin by electrical energy from a battery connected to the cable positioned within the cable guide.

2. The apparatus of claim 1, wherein the processor is configured to determine the voltage of the battery, and to determine the current running through the cable positioned within the cable guide using the signals from the tri-axis Hall Effect sensor.

3. The apparatus of claim 1, further comprising a temperature transducer electrically connected to the processor, wherein the processor is configured to measure the temperature of the battery.

4. The apparatus of claim 1, further comprising a magnetic flux shield configured to wrap around the clamped cable positioned within the cable guide when the cable is clamped and not to come between the tri-axis Hall Effect sensor and the cable positioned within the cable guide.

5. The apparatus of claim 4, wherein the magnetic flux shield provides magnetic flux concentration for the tri-axis Hall Effect sensor, standardizes a current measurement by the tri-axis Hall Effect sensor, and prevents interference from other current carrying devices.

6. The apparatus of claim 1, wherein the clamping structure comprises first and second mechanical clamping portions configured to be clamped together to clamp the cable within the cable guide.

7. The apparatus of claim 6, wherein the cable guide is U-shaped and attached to one of the first and second mechanical clamping portions, wherein the magnetic flux shield is U-shaped and attached to the other of the first and second mechanical clamping portions and positioned such that it covers the open end and sides of the cable guide and the cable positioned within the cable guide is clamped between the cable guide and a magnetic flux shield when the mechanical clamping portions are clamped together around the cable.

8. The apparatus of claim 6, wherein the first and second mechanical clamping portions comprise aligned holes such that the mechanical clamping portions can be securely clamped to each other with nuts and bolts.

9. The apparatus of claim 1, further comprising a printed circuit board attached to the clamping structure, wherein the electrical power pin is electrically connected to the printed circuit board.

10. The apparatus of claim 9, wherein the tri-axis Hall effect sensor is positioned on the printed circuit board.

11. The apparatus of claim 9, wherein the tri-axis Hall Effect sensor is mounted on the printed circuit board and positioned adjacent to the cable guide when the clamping structure is clamping the cable.

12. The apparatus of claim 9, wherein the electrical power pin is projecting into the space within the cable guide.

13. A battery data sensor apparatus, comprising:
a clamping structure comprising first and second mechanical clamping portions;
a cable guide attached to the clamping structure and configured to limit lateral movement of a first cable positioned within the cable guide;
a printed circuit board attached to the clamping structure;
a tri-axis Hall Effect sensor mounted on the printed circuit board and positioned adjacent to the cable guide when the first and second mechanical clamping portions are clamped together to sense a current flowing through the first cable positioned within the cable guide;
a first electrical power pin electrically connected to the printed circuit board and projecting into the space within the cable guide and configured to pierce the first cable positioned within the cable guide to provide an electrical connection to the first cable;
a processor electrically connected to the printed circuit board and configured to analyze signals from the tri-axis Hall Effect sensor; and
a magnetic flux shield configured to wrap around the first cable positioned within the cable guide when the first and second mechanical clamping portions are clamped together, and not to come between the tri-axis Hall Effect sensor and the first cable positioned within the cable guide;
wherein the first and second mechanical clamping portions are configured to be clamped together to secure the first cable positioned within the cable guide and prevent movement of the first cable relative to the tri-axis Hall Effect sensor;
wherein the processor is configured to be powered by electrical energy from a battery connected to the first cable positioned within the cable guide.

14. The battery data sensor apparatus of claim 13, wherein the cable guide is U-shaped and connected to the printed circuit board, wherein the printed circuit board is attached to one of the first and second mechanical clamping portions having a housing protecting the printed circuit board, wherein the magnetic flux shield is U-shaped and attached to the other of the first and second mechanical clamping portions and positioned such that it covers the open end and sides of the cable guide and the first cable positioned within the cable guide is clamped between the cable guide and the magnetic flux shield and the tri-axis Hall effect sensor is positioned within the open end of the magnetic flux shield when the first and second mechanical clamping portions are clamped together, wherein the first and second mechanical clamping portions comprise aligned holes such that the mechanical clamping portions can be securely clamped to each other with nuts and bolts.

15. The battery data sensor apparatus of claim 14, wherein the processor is configured to determine the voltage of the battery, and to determine the current running through the first cable positioned within the cable guide using the signals from the tri-axis Hall Effect sensor.

16. The battery data sensor apparatus of claim 15, further comprising a temperature transducer electrically connected to the processor, wherein the processor is configured to measure the temperature of the battery.

17. The battery data sensor apparatus of claim 16, further comprising a second cable guide configured to limit lateral movement of a second cable positioned within the second cable guide and a second electrical power pin projecting into the space within the second cable guide and configured to pierce the second cable positioned within the second cable guide to provide an electrical connection to the second cable.

18. A method of using a battery data sensor apparatus, the battery data sensor apparatus comprising:
a clamping structure comprising first and second mechanical clamping portions;

a cable guide attached to the clamping structure and configured to limit lateral movement of a first cable positioned within the cable guide;

a printed circuit board attached to the clamping structure;

a tri-axis Hall Effect sensor mounted on the printed circuit board and positioned adjacent to the cable guide when the first and second mechanical clamping portions are clamped together to sense a current flowing through the first cable positioned within the cable guide;

an electrical power pin electrically connected to the printed circuit board and projecting into the space within the cable guide and configured to pierce the first cable positioned within the cable guide to provide an electrical connection to the first cable;

a processor electrically connected to the printed circuit board and configured to analyze signals from the tri-axis Hall Effect sensor; and a magnetic flux shield configured to wrap around the first cable positioned within the cable guide when the first and second mechanical clamping portions are clamped together, and not to come between the tri-axis Hall Effect sensor and the first cable positioned within the cable guide;

wherein the first and second mechanical clamping portions are configured to be clamped together to secure the first cable positioned within the cable guide and prevent movement of the first cable relative to the tri-axis Hall Effect sensor;

wherein the processor is configured to be powered by electrical energy from a battery connected to the first cable positioned within the cable guide;

the method comprising:

positioning a battery cable connected to a battery within the cable guide and piercing the battery cable with the electrical power pin;

clamping the first and second mechanical clamping portions together around the battery cable by inserting bolts through the aligned holes and securing them with nuts;

measuring the voltage of the battery connected to the battery cable and the current through the battery cable using the processor; and transmitting the voltage and current readings.

\* \* \* \* \*